US012672495B2

(12) United States Patent (10) Patent No.: US 12,672,495 B2
Chen et al. (45) Date of Patent: Jun. 30, 2026

(54) METHOD OF MANUFACTURING INTERCONNECTION STRUCTURE

(71) Applicant: MIKRO MESA TECHNOLOGY CO., LTD., Apia (WS)

(72) Inventors: Li-Yi Chen, Tainan City (TW); Chieh-Ting Chen, Hsinchu City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 453 days.

(21) Appl. No.: 18/530,218

(22) Filed: Dec. 6, 2023

(65) Prior Publication Data

US 2025/0191932 A1     Jun. 12, 2025

(51) Int. Cl.
H10P 50/00        (2026.01)
H10W 20/00        (2026.01)

(52) U.S. Cl.
CPC ........... H10P 50/71 (2026.01); H10W 20/064 (2026.01); *H10W 20/031* (2026.01); *H10W 20/043* (2026.01)

(58) Field of Classification Search
CPC ...... H10P 50/71; H10P 50/267; H10P 50/667; H10W 20/064; H10W 20/054; H10W 20/031; H10W 20/043
See application file for complete search history.

(56) References Cited

U.S. PATENT DOCUMENTS

| | | | |
|---|---|---|---|
| 2008/0150434 A1* | 6/2008 | Sung ...................... | H10D 86/60 |
| | | | 257/E29.151 |
| 2011/0108848 A1* | 5/2011 | Lee .................... | H10K 59/1213 |
| | | | 438/34 |
| 2012/0104399 A1* | 5/2012 | Choi ...................... | H10D 86/60 |
| | | | 257/E33.053 |
| 2018/0166015 A1* | 6/2018 | Beak .................. | H10D 86/0231 |

* cited by examiner

*Primary Examiner* — Yara B Green
*Assistant Examiner* — Akhee Sarker-Nag
(74) *Attorney, Agent, or Firm* — CKC & Partners Co., LLC

(57)        ABSTRACT
A method of manufacturing an interconnection structure includes: forming a first patterned photoresist on a bottom metal layer; etching the bottom metal layer to form first and second lower metal patterns; partially anodizing the etched bottom metal layer; removing the first patterned photoresist to expose a surface portion of the second lower metal pattern that is unanodized; depositing a conductive layer on the anodized bottom metal layer to be in contact with the surface portion; and etching the conductive layer through a second patterned photoresist to form a first upper conductive pattern that is above and electrically isolated from the first lower metal pattern and a second upper conductive pattern that is above the second lower metal pattern and in contact with the surface portion, in which the first and second upper conductive patterns entirely cover all non-insulated top surface of the anodized bottom metal layer.

17 Claims, 13 Drawing Sheets

METHOD OF MANUFACTURING INTERCONNECTION STRUCTURE

BACKGROUND

Field of Invention

The present disclosure relates to a method of manufacturing an interconnection structure.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of manufacturing an interconnection structure includes: forming a first patterned photoresist on a bottom metal layer having an atomic ratio of aluminum greater than 80%, in which the first patterned photoresist has a first mask portion and a second mask portion thicker than the first mask portion; etching the bottom metal layer through the first patterned photoresist to form a first lower metal pattern and a second lower metal pattern respectively covered by the first and second mask portions; removing the first mask portion; anodizing the etched bottom metal layer, in which the anodized bottom metal layer has an unanodized part after the anodizing; removing the second mask portion to expose a surface portion of the second lower metal pattern that is unanodized; depositing a conductive layer on the anodized bottom metal layer, in which the conductive layer is in contact with the surface portion of the second lower metal pattern; and etching the conductive layer through a second patterned photoresist to form a first upper conductive pattern and a second upper conductive pattern, in which the first upper conductive pattern is above and electrically isolated from the first lower metal pattern by an anodized part of the bottom metal layer, the second upper conductive pattern is above the second lower metal pattern and in contact with the surface portion of the second lower metal pattern, and the first and second upper conductive patterns entirely cover all non-insulated top surface of the anodized bottom metal layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
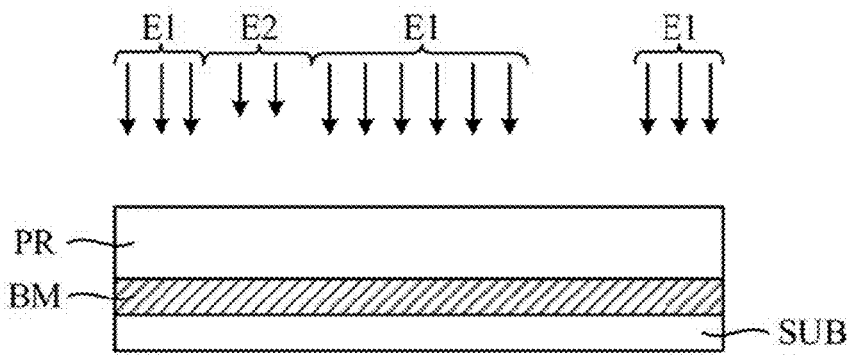
FIGS. 1A to 1I are schematic cross-sectional views of intermediate stages of a method of manufacturing an interconnection structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1A. FIG. 1A is a schematic cross-sectional view of an intermediate stage of a method of manufacturing an interconnection structure according to some embodiments of the present disclosure. As shown in FIG. 1A, a bottom metal layer BM is formed on a substrate SUB, and a photoresist PR is formed on the bottom metal layer BM. An atomic ratio of aluminum in the bottom metal layer BM is greater than 80%. A material of the photoresist PR is positive tone photoresist. First regions of the photoresist PR are exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

Figure 1B:
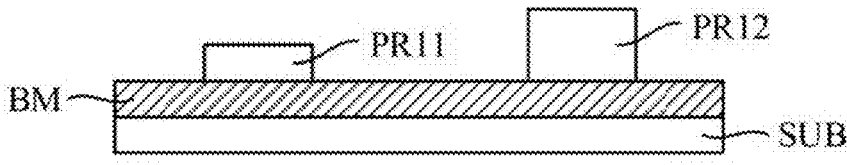

Reference is made to FIG. 1B. FIG. 1B is a schematic cross-sectional view of an intermediate stage of a method of manufacturing an interconnection structure according to some embodiments of the present disclosure. The intermediate stage shown in FIG. 1A may be sequentially followed by the intermediate stage shown in FIG. 1B. As shown in FIG. 1B, the exposed photoresist PR is then developed to form a first patterned photoresist PR1. The first patterned photoresist PR1 has a first mask portion PR11 and a second mask portion PR12. The second mask portion PR12 is thicker than the first mask portion PR11. It can be seen that the regions of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Figure 1C:
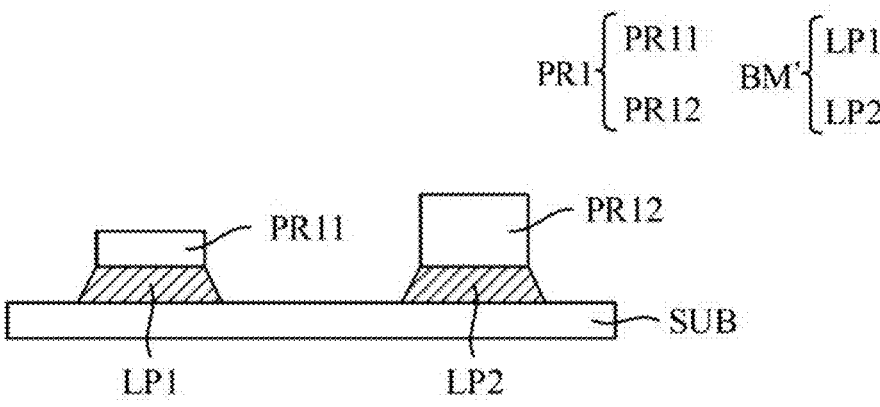

Reference is made to FIG. 1C. FIG. 1C is a schematic cross-sectional view of an intermediate stage of a method of manufacturing an interconnection structure according to some embodiments of the present disclosure. The intermediate stage shown in FIG. 1B may be sequentially followed by the intermediate stage shown in FIG. 1C. As shown in FIG. 1C, the bottom metal layer BM is etched through the first patterned photoresist PR1 to form a first lower metal pattern LP1 and a second lower metal pattern LP2 that are respectively covered by the first mask portion PR11 and the second mask portion PR12.

In some embodiments, a wet etching process may be performed to etch the bottom metal layer BM. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard. In some other embodiments, hydrogen peroxide and sulfuric acid may be used in the wet etching process.

In some embodiments, a dry etching process may be performed to etch the bottom metal layer BM. For example, the dry etching process may be an ECCP (Enhanced Capacitance Coupled Plasma) process using, for example, $Cl_2$ and $BCl_3$, but the present disclosure is not limited in this regard.

Figure 1D:
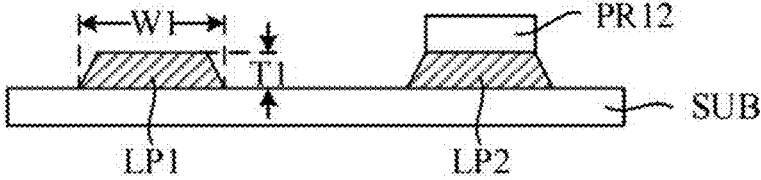

Reference is made to FIG. 1D. FIG. 1D is a schematic cross-sectional view of an intermediate stage of a method of manufacturing an interconnection structure according to some embodiments of the present disclosure. The intermediate stage shown in FIG. 1C may be sequentially followed by the intermediate stage shown in FIG. 1D. As shown in FIG. 1D, the first mask portion PR11 is removed to expose the top surfaces of the first lower metal pattern LP1. In some embodiments, an ashing process is performed to the first mask portion PR11 and the second mask portion PR12 until the first mask portion PR11 is entirely removed and the second mask portion PR12 still covers the top surface of the second lower metal pattern LP2. In some embodiments, oxygen plasma is used in the ashing process to perform the erosion of the first mask portion PR11 and the second mask portion PR12.

Figure 1E:
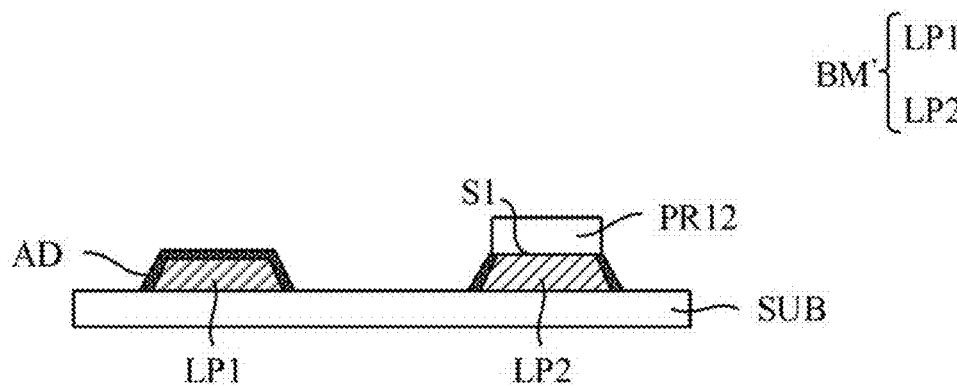

Reference is made to FIG. 1E. FIG. 1E is a schematic cross-sectional view of an intermediate stage of a method of manufacturing an interconnection structure according to some embodiments of the present disclosure. The intermediate stage shown in FIG. 1D may be sequentially followed by the intermediate stage shown in FIG. 1E. As shown in FIG. 1E, the etched bottom metal layer BM' is anodized. The first lower metal pattern LP1 and the second lower metal pattern LP2 are partially anodized after the anodizing and thus have anodized parts AD (i.e., anodic oxide). The anodized second lower metal pattern LP2 has a surface portion S1 that is unanodized and in contact with the second mask portion PR12.

In some embodiments, the etched bottom metal layer BM' is anodized to reach a termination voltage. Each of the first lower metal pattern LP1 and the second lower metal pattern LP2 has a thickness T1 (e.g., a vertical length of the first lower metal pattern LP1 in FIG. 1D) and a width W1 (e.g., a lateral length of the first lower metal pattern LP1 in FIG. 1D) before being anodized, and the termination voltage is less than a smallest one of the thickness T1 and the width W1 in nm divided by 0.9 $nm$-$V^{-1}$. In this way, the etched bottom metal layer BM' will not be fully anodized and leave conductive parts.

In some embodiments, the width W1 of the first lower metal pattern LP1 is greater than the thickness T1 of the first lower metal pattern LP1, but the disclosure is not limited in this regard.

In some embodiments, the termination voltage that the etched bottom metal layer BM' is anodized to reach is greater than 10 Volt and smaller than 500 Volt. It should be pointed out that if the etched bottom metal layer BM' is anodized to reach a termination voltage greater than 500 Volt, the thickness of the anodized parts AD of the etched bottom metal layer BM' (e.g., the anodized part AD of the first lower metal pattern LP1) may be too thick and result in high operation voltage of thin-film transistors.

In some embodiments, the etched bottom metal layer BM' is anodized by applying a constant current greater than 0.5 mA/cm$^2$. In some embodiments, the constant current is between 0.05 mA/cm$^2$ and 5 mA/cm$^2$.

In some embodiments, the etched bottom metal layer BM' is anodized until the termination voltage is reached and kept for at least 300 seconds. It makes more uniform thickness of the anodized parts AD of the etched bottom metal layer BM'.

In some embodiments, an annealing process may be performed to the anodized bottom metal layer BM'. In this way, the resistance of the anodized bottom metal layer BM' (e.g., the anodized part AD of the anodized first lower metal pattern LP1) to a second wet etching process (if any) can be increased. In some embodiments, an annealing temperature used in the annealing process is greater than 200° C., but the disclosure is not limited in this regard.

In some embodiments, the etched bottom metal layer BM' is anodized by using an electrolyte with a pH value between pH5 and pH8. It should be pointed out that if the pH value is smaller than pH5 or greater than pH8, there will be more pores in the anodized parts AD of the etched bottom metal layer BM'.

In some embodiments, the etched bottom metal layer BM' is anodized by using an electrolyte containing a content of water less than 45 wt %. In this way, the Hydrogen content in the anodized parts AD of the etched bottom metal layer BM' can be small. The Hydrogen content may reduce the breakdown voltage of the gate insulator. Hydrogen sometimes affects the semiconductor layer A and reduces its stability.

In some embodiments, the etched bottom metal layer BM' is anodized by using an electrolyte containing water, ethylene glycol, and ammonium tartrate. For example, the electrolyte may contain ethylene glycol of about 68.5 wt %, water of about 30 wt %, and ammonium tartrate of about 1.5 wt %, but the disclosure is not limited in this regard.

In some embodiments, the etched bottom metal layer BM' is anodized at a temperature under 15° C. In this way, the anodized parts AD of the etched bottom metal layer BM' will be denser and thus the quality can be improved.

Figure 2:
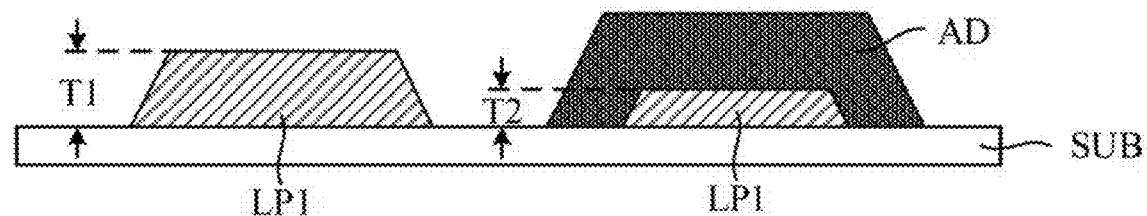
FIG. 2 is a schematic cross-sectional view of a gate electrode before and after being anodized according to some embodiments of the present disclosure.

Reference is made to FIG. 2. FIG. 2 is a schematic cross-sectional view of the first lower metal pattern LP1 before and after being anodized according to some embodiments of the present disclosure. As shown in FIG. 2, in some embodiments, a thickness T2 of the unanodized part of the anodized first lower metal pattern LP1 is equal to or greater than $\frac{1}{10}$ of a thickness T1 of the first lower metal pattern LP1 before the etched bottom metal layer BM' is anodized. In this way, the resistance of the etched bottom metal layer BM' will not be too large.

Figure 1F:
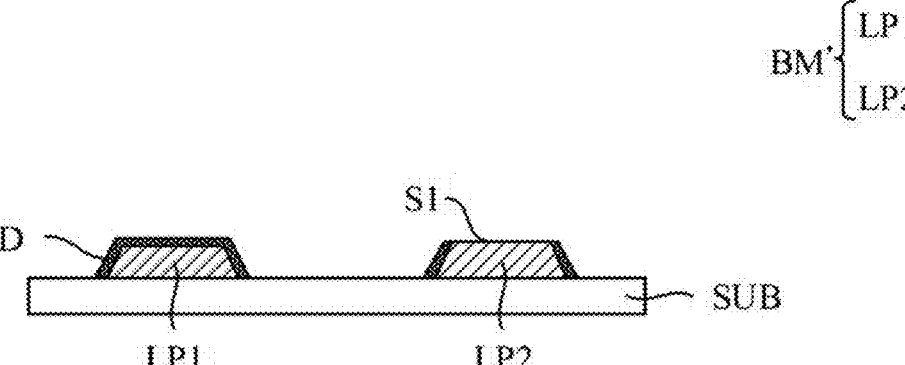

Reference is made to FIG. 1F. FIG. 1F is a schematic cross-sectional view of an intermediate stage of a method of manufacturing an interconnection structure according to some embodiments of the present disclosure. The intermediate stage shown in FIG. 1E may be sequentially followed by the intermediate stage shown in FIG. 1F. As shown in FIG. 1F, the second mask portion PR12 is removed to expose the surface portion S1 of the second lower metal pattern LP2 that is unanodized.

Figure 1G:
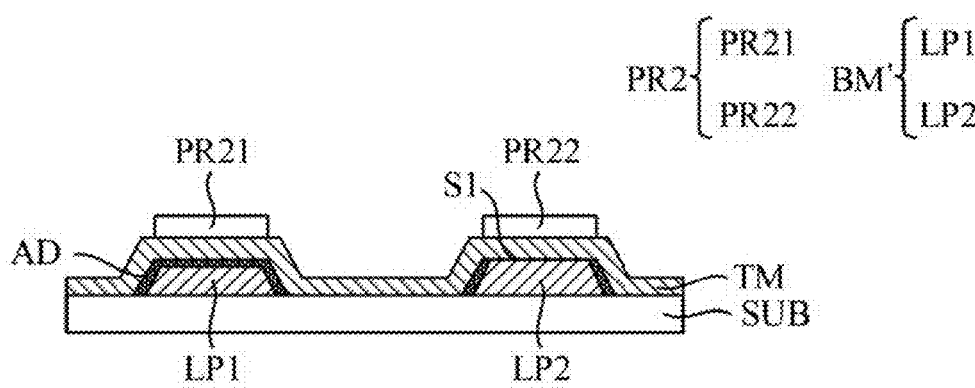

Reference is made to FIG. 1G. FIG. 1G is a schematic cross-sectional view of an intermediate stage of a method of manufacturing an interconnection structure according to some embodiments of the present disclosure. The intermediate stage shown in FIG. 1F may be sequentially followed by the intermediate stage shown in FIG. 1G. As shown in FIG. 1G, a top metal layer TM is deposited on the anodized bottom metal layer BM', in which the top metal layer TM is in contact with the surface portion S1 of the second lower metal pattern LP2. In addition, a second patterned photoresist PR2 is deposited on the top metal layer TM. The second patterned photoresist PR2 has a first mask portion PR21 and a second mask portion PR22 respectively above the first lower metal pattern LP1 and the second lower metal pattern LP2. In some embodiments, the surface portion S1 of the second lower metal pattern LP2 entirely overlaps a vertical projection of the second mask portion PR22 on the surface portion S1.

Figure 1H:
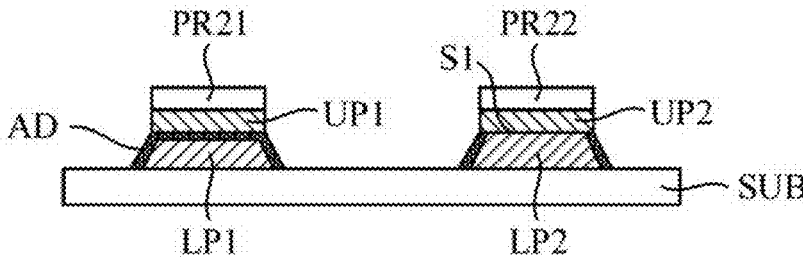

Reference is made to FIG. 1H. FIG. 1H is a schematic cross-sectional view of an intermediate stage of a method of manufacturing an interconnection structure according to some embodiments of the present disclosure. The intermediate stage shown in FIG. 1G may be sequentially followed by the intermediate stage shown in FIG. 1H. As shown in FIG. 1H, the top metal layer TM is etched through the second patterned photoresist PR2 to form a first upper metal pattern UP1 and a second upper metal pattern UP2. The first upper metal pattern UP1 is above and electrically isolated from the first lower metal pattern LP1 by the anodized part AD therebetween. The second upper metal pattern UP2 is above the second lower metal pattern LP2 and in contact with the surface portion S1 of the second lower metal pattern LP2. The first upper metal pattern UP1 and the second upper metal pattern UP2 entirely cover all non-insulated top surface of the anodized bottom metal layer BM'.

In some embodiments, an etch selectivity of the top metal layer TM and the anodized part AD of the etched bottom metal layer BM' in the step of etching the top metal layer TM is higher than 5.0.

Figure 1I:
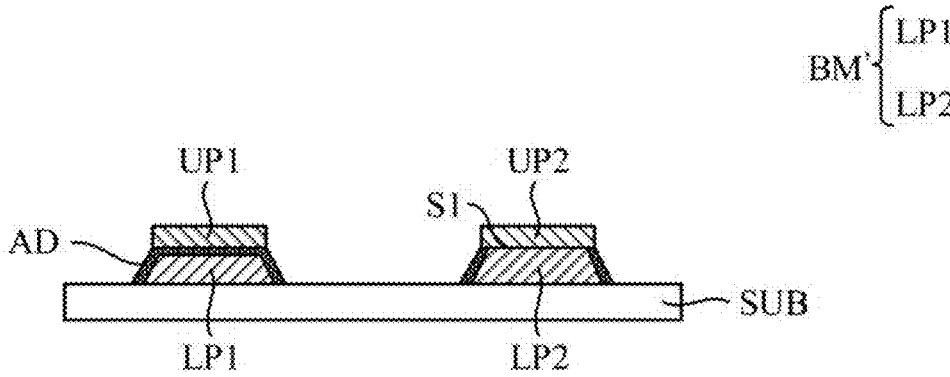

Reference is made to FIG. 1I. FIG. 1I is a schematic cross-sectional view of an intermediate stage of a method of manufacturing an interconnection structure according to some embodiments of the present disclosure. The intermediate stage shown in FIG. 1I may be sequentially followed by the intermediate stage shown in FIG. 1H. As shown in FIG. 1I, the second patterned photoresist PR2 is entirely removed, such that the first lower metal pattern LP1 and the first upper metal pattern UP1 form a metal cross over structure, and the second lower metal pattern LP2 and the second upper metal pattern UP2 form a contact structure.

Figure 3A:
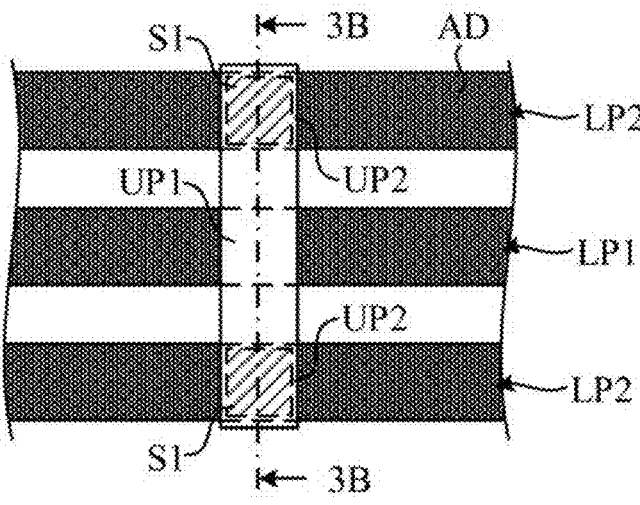
FIG. 3A is a partial top view of an interconnection structure according to some embodiments of the present disclosure.
Figure 3B:
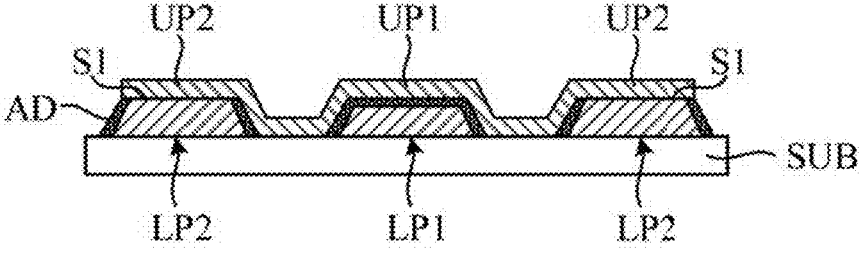
FIG. 3B is a partial cross-sectional view of the interconnection structure taken along line 3B-3B according to some embodiments of the present disclosure.

Reference is made to FIGS. 3A and 3B. FIG. 3A is a partial top view of an interconnection structure according to some embodiments of the present disclosure. FIG. 3B is a partial cross-sectional view of the interconnection structure taken along line 3B-3B according to some embodiments of the present disclosure. As shown in FIGS. 3A and 3B, a first lower metal pattern LP1 is spaced apart from and extended between two second lower metal patterns LP2. A first upper metal pattern UP1 extends across the top of the first lower metal pattern LP1 and is located between two second upper metal patterns UP2. The two second upper metal patterns UP2 respectively cover the two second lower metal patterns LP2 and are in contact with the surface portions S1 of the two second lower metal patterns LP2 without exposing the surface portions S1. In this way, the two second lower metal patterns LP2 respectively located at opposite sides of the first lower metal pattern LP1 can be electrically connected via a combination of the first upper metal pattern UP1 and the two second upper metal patterns UP2 above, and thus an interconnection structure is formed by the combination.

Figure 3C:
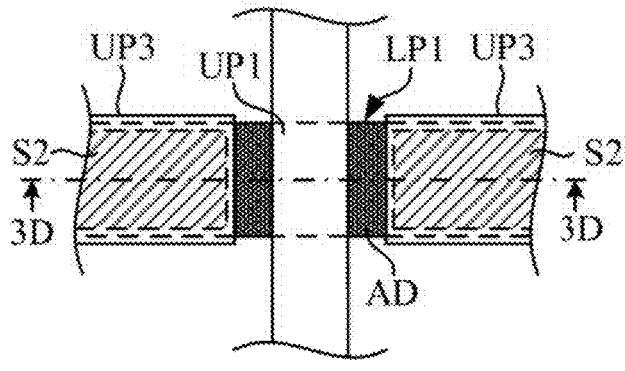
FIG. 3C is a partial top view of an interconnection structure according to some embodiments of the present disclosure.
Figure 3D:
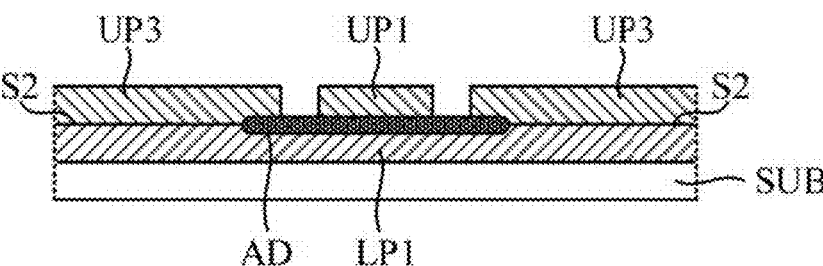
FIG. 3D is a partial cross-sectional view of the interconnection structure taken along line 3D-3D according to some embodiments of the present disclosure.

Reference is made to FIGS. 3C and 3D. FIG. 3C is a partial top view of an interconnection structure according to some embodiments of the present disclosure. FIG. 3D is a partial cross-sectional view of the interconnection structure taken along line 3D-3D according to some embodiments of the present disclosure. The interconnection structure shown in FIGS. 3A and 3B are partially shown in FIGS. 3C and 3D.

Specifically, FIGS. 3C and 3D show the first upper metal pattern UP1 of the interconnection structure without showing the two second upper metal patterns UP2. In addition, the anodized part AD of the anodized first lower metal pattern LP1 exposes two surface portions S2 of the first lower metal pattern LP1, and the first upper metal pattern UP1 is located between the two surface portions S2. Two third upper metal patterns UP3 respectively cover and are in contact with the surface portions S2 of the first lower metal pattern LP1 without exposing the surface portions S2. It should be pointed out that the two third upper metal patterns UP3 may be also formed from the top metal layer TM. Compared to the first lower metal pattern LP1 shown in FIGS. 3A and 3B, the two third upper metal patterns UP3 can further increase conductivity of the first lower metal pattern LP1 shown in FIGS. 3C and 3D.

Accordingly, it can be seen that the method of manufacturing an interconnection structure of the embodiments as shown in FIGS. 1A to 1I only uses two sets of PEP (Photo Engraving Process). Therefore, the cost of manufacturing an interconnection structure can be significantly reduced and the manufacturing efficiency can be effectively enhanced.

In some embodiments, the method of manufacturing an interconnection structure of the present disclosure may be used to manufacture a thin-film transistor, which can be exemplified by FIG. 4A to FIG. 4E.

Figure 4A:
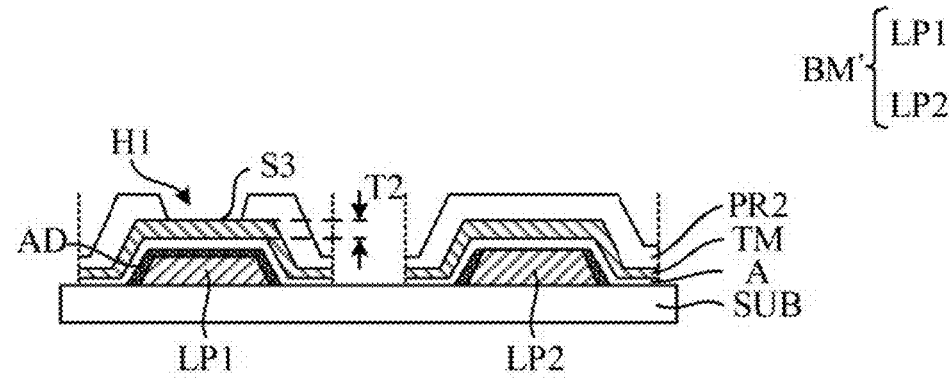
FIGS. 4A to 4E are schematic cross-sectional views of intermediate stages of a method of manufacturing an interconnection structure according to some embodiments of the present disclosure.

Reference is made to FIG. 4A. FIG. 4A is a schematic cross-sectional view of an intermediate stage of a method of manufacturing an interconnection structure according to some embodiments of the present disclosure. To further manufacture a thin-film transistor, the intermediate stage shown in FIG. 1F may be sequentially followed by the intermediate stage shown in FIG. 4A. As shown in FIG. 4A, a semiconductor layer A is deposited on the anodized bottom metal layer BM' to cover the first lower metal pattern LP1 and the second lower metal pattern LP2, such that the first lower metal pattern LP1 and the second lower metal pattern LP2 are in contact with the semiconductor layer A. The first lower metal pattern LP1 serves as a gate electrode, and the anodized part AD of the anodized first lower metal pattern LP1 serves as a gate insulator.

In some embodiments, the semiconductor layer A is an oxide semiconductor layer. In addition, the semiconductor layer A includes at least one element of aluminum, gallium, indium, zinc, tin, and zirconium, but the disclosure is not limited in this regard. In some other embodiments, the semiconductor layer A includes $MoS_2$.

In some embodiments, the semiconductor layer A may be deposited by a PVD (Physical Vapor Deposition) process or a CVD (Chemical Vapor Deposition) process.

In some embodiments, the semiconductor layer A may be a multi-layer structure containing different compositions. For example, the semiconductor layer A may be a double-layer structure including IZO (indium gallium zinc oxide) and IGZTO (indium gallium zinc tin oxide), but the disclosure is not limited in this regard. In this way, the channel mobility can be improved.

As shown in FIG. 4A, a top metal layer TM is deposited on the semiconductor layer A. It should be pointed out that a surface of the top metal layer TM in contact with the semiconductor layer A contains metal that can be anodized (e.g., aluminum). The combination of the semiconductor layer A and the top metal layer TM serves as a conductive layer. A second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 1A and 1B and will not be repeated here. The second patterned photoresist PR2 has a first hollow portion H1 exposing a surface portion S3 of the top metal layer TM.

In some embodiments, the step of depositing the semiconductor layer A and the step of depositing the top metal layer TM are performed continuously in vacuum That is, the semiconductor layer A does not come into contact with the atmosphere before the top metal layer TM is deposited. In some other embodiments, the step of depositing the semiconductor layer A and the step of depositing the top metal layer TM are performed in chambers with transferring in vacuum. In this way, the oxide semiconductor layer A can be prevented from contacting with air.

Figure 4B:
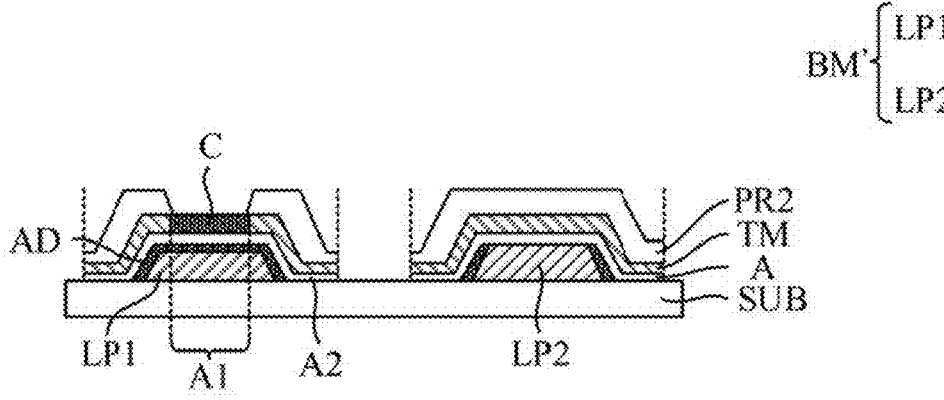

Reference is made to FIG. 4B. FIG. 4B is a schematic cross-sectional view of an intermediate stage of a method of manufacturing an interconnection structure according to some embodiments of the present disclosure. The intermediate stage shown in FIG. 4A may be sequentially followed by the intermediate stage shown in FIG. 4B. As shown in FIG. 4B with reference to FIG. 4A, the surface portion S3 of the top metal layer TM is anodized through the second patterned photoresist PR2 until the top metal layer TM has an anodized segment C (i.e., anodic oxide) extended from the surface portion S3 of the top metal layer TM to a side of the top metal layer TM facing the semiconductor layer A. As mentioned above, the surface of the top metal layer TM in contact with the semiconductor layer A contains metal that can be anodized (e.g., aluminum), so that the top metal layer TM can be anodized to extend the anodized segment C to the side of the top metal layer TM facing the semiconductor layer A.

In some embodiments, the surface portion S3 of the top metal layer TM is anodized to reach a termination voltage. The top metal layer TM has a thickness T2 before being anodized, as shown in FIG. 4A. The termination voltage is greater than the thickness T2 in nm divided by 1.0 nm-$V^{-1}$. In this way, it can be ensured that the anodized segment C can reach the side of the top metal layer TM facing the semiconductor layer A.

In some embodiments, as shown in FIG. 4B, the semiconductor layer A has an active area A1 and an inactive area A2. The active area A1 is covered by and in contact with the anodized segment C. The active area A1 may be defined by a vertical projection of the anodized segment C projected on the semiconductor layer A. The inactive area A2 is covered by and in contact with the other conductive segment of the top metal layer TM. In order to reduce the contact resistance of the inactive area A2 relative to the top metal layer TM, an annealing process may be performed to make the inactive area A2 react with aluminum in the top metal layer TM. Aluminum increases the oxygen vacancies of the inactive area A2 of the semiconductor layer A. The annealing process also improves the stability of the active area A1 of the semiconductor layer A.

Figure 4C:
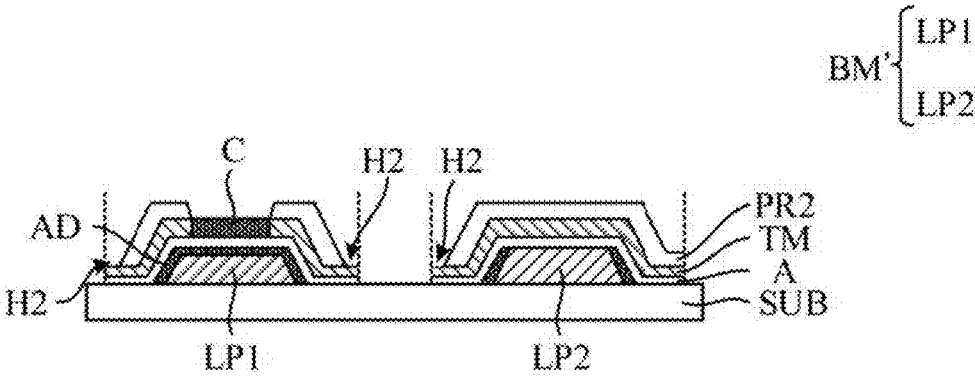

Reference is made to FIG. 4C. FIG. 4C is a schematic cross-sectional view of an intermediate stage of a method of manufacturing an interconnection structure according to some embodiments of the present disclosure. The intermediate stage shown in FIG. 4B may be sequentially followed by the intermediate stage shown in FIG. 4C. As shown in FIG. 4C, second hollow portions H2 are formed in the second patterned photoresist PR2. In some embodiments, an ashing process is performed to the second patterned photoresist PR2 until the second hollow portions H2 are formed to expose portions of the top metal layer TM. In some embodiments, oxygen plasma is used in the ashing process to perform the erosion of the second patterned photoresist PR2.

Figure 4D:
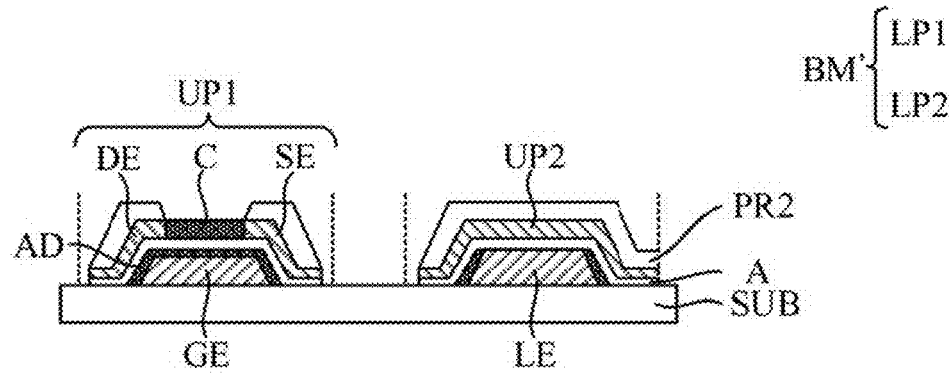

Reference is made to FIG. 4D. FIG. 4D is a schematic cross-sectional view of an intermediate stage of a method of manufacturing an interconnection structure according to some embodiments of the present disclosure. The intermediate stage shown in FIG. 4C may be sequentially followed by the intermediate stage shown in FIG. 4D. As shown in FIG. 4D, the top metal layer TM is etched through the second hollow portions H2 to form a first upper metal pattern UP1 and a second upper metal pattern UP2. The first upper metal pattern UP1 is above the anodized first lower metal pattern LP1 and has a drain electrode DE and a source electrode SE. The drain electrode DE and the source electrode SE are connected to the anodized segment C and electrically isolated from each other by the anodized segment C. The anodized segment C serves as a channel protect structure. The second upper metal pattern UP2 is above the second lower metal pattern LP2. The second upper metal pattern UP2 forms a contact structure with the second lower metal pattern LP2.

In some embodiments, an etch selectivity of the top metal layer TM and the anodized segment C in the step of etching the top metal layer TM (as shown in FIG. 4D) is higher than 2.0.

Figure 4E:
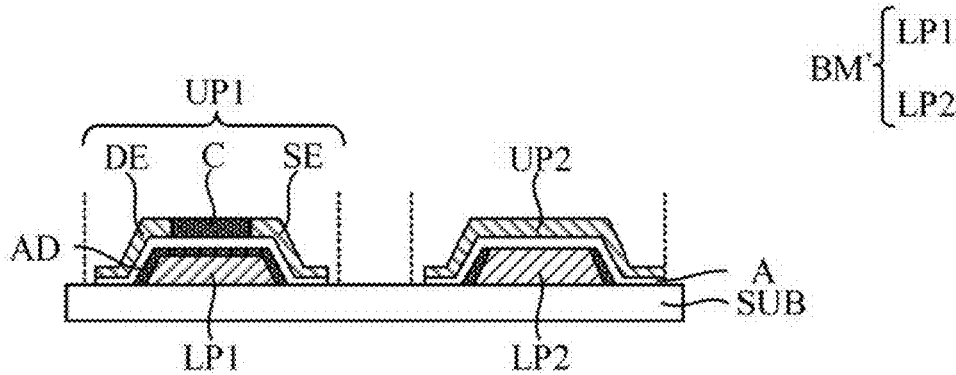

Reference is made to FIG. 4E. FIG. 4E is a schematic cross-sectional view of an intermediate stage of a method of manufacturing an interconnection structure according to some embodiments of the present disclosure. The intermediate stage shown in FIG. 4D may be sequentially followed by the intermediate stage shown in FIG. 4E. As shown in FIG. 4E, the second patterned photoresist PR2 is removed to expose the first upper metal pattern UP1 and the second upper metal pattern UP2.

In some embodiments, a thickness of the semiconductor layer A is equal to or smaller than 100 nm. In this way, the back channel leakage may be reduced in certain circumstances. In addition, the problem of excessive contact resistance between the semiconductor layer A and other layers in contact with the semiconductor layer A (i.e., the second lower metal pattern LP2, the second upper metal pattern UP2, the drain electrode DE, and the source electrode SE) can be avoided.

Figure 5:
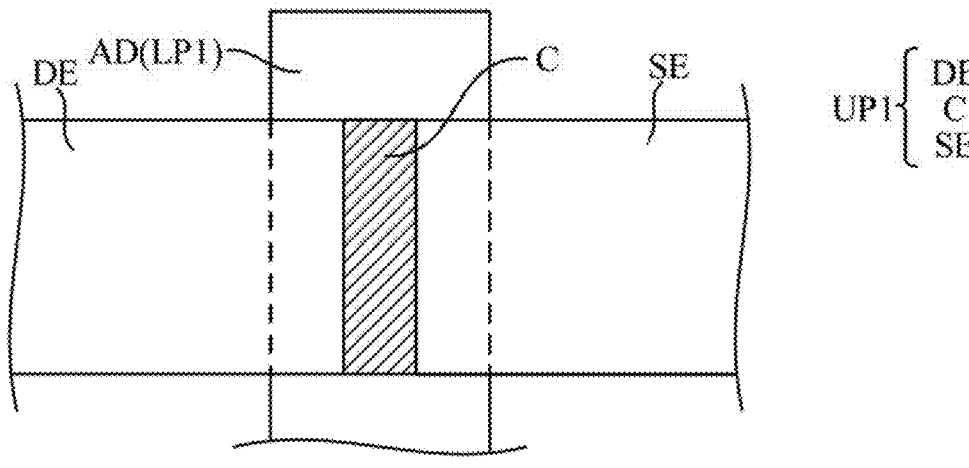
FIG. 5 is a partial top view of the structure shown in FIG. 4E according to some embodiments of the present disclosure.
Figure 6A:
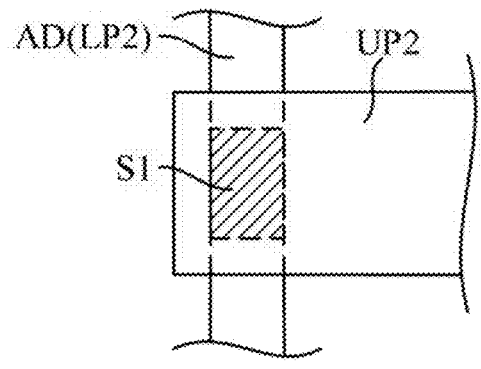
FIG. 6A is another partial top view of the structure shown in FIG. 4E according to some embodiments of the present disclosure.

Reference is made to FIGS. 5 and 6A. FIGS. 5 and 6A are partial top views of the structure shown in FIG. 4E according to some embodiments of the present disclosure. In detail, FIG. 5 is a partial schematic diagram showing the anodized first lower metal pattern LP1 (covered by the anodized part AD) and the first upper metal pattern UP1. FIG. 6A is a partial schematic diagram showing the anodized second lower metal pattern LP2 (covered by the anodized part AD and exposing the surface portion S1) and the second upper metal pattern UP2 that form the aforementioned contact structure.

Figure 6B:
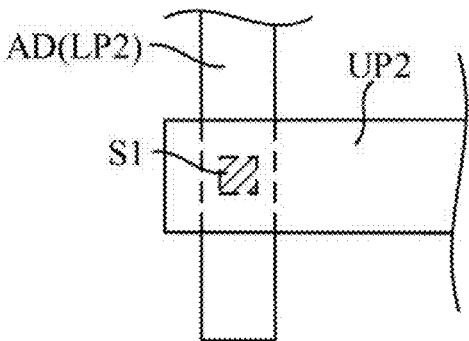
FIG. 6B is another partial top view of the structure shown in FIG. 4E according to some embodiments of the present disclosure.

Reference is made to FIG. 6B. FIG. 6B is another partial top view of the structure shown in FIG. 4E according to some embodiments of the present disclosure. As shown in FIG. 6B, the surface portion S1 of the second lower metal pattern LP2 exposed by the anodized part AD has a smaller area than that shown in FIG. 6A.

Figure 6C:
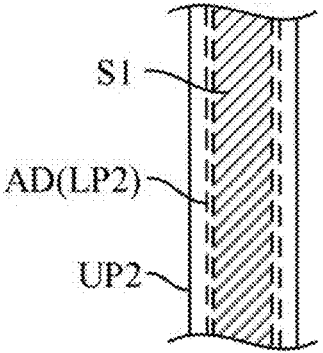
FIG. 6C is another partial top view of the structure shown in FIG. 4E according to some embodiments of the present disclosure.

Reference is made to FIG. 6C. FIG. 6C is another partial top view of the structure shown in FIG. 4E according to some embodiments of the present disclosure. As shown in FIG. 6C, both the surface portion S1 of the second lower metal pattern LP2 exposed by the anodized part AD and the second upper metal pattern UP2 covering the second lower metal pattern LP2 are extended along the second lower metal pattern LP2.

Accordingly, it can be seen that the method of manufacturing an interconnection structure of the embodiments as shown in FIGS. 1A to 1I and FIGS. 4A to 4E can be used to manufacture a thin-film transistor by only using two sets of PEP. Therefore, the cost of manufacturing a thin-film transistor can be significantly reduced and the manufacturing efficiency can be effectively enhanced.

Figure 7A:
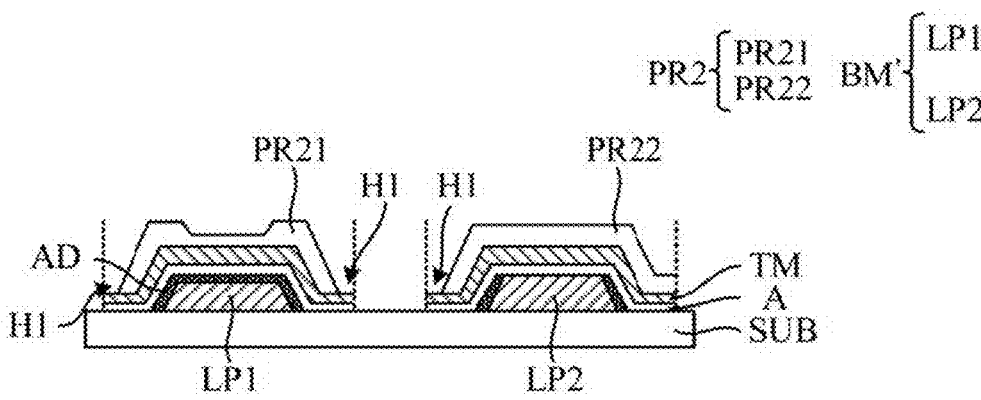
FIGS. 7A to 7E are schematic cross-sectional views of intermediate stages of a method of manufacturing an interconnection structure according to some embodiments of the present disclosure.

Reference is made to FIG. 7A. FIG. 7A is a schematic cross-sectional view of an intermediate stage of a method of manufacturing an interconnection structure according to some embodiments of the present disclosure. In some embodiments, the intermediate stage shown in FIG. 1F may be directly followed by the intermediate stage shown in FIG. 7A. As shown in FIG. 7A, a semiconductor layer A is deposited on the anodized bottom metal layer BM', and a top metal layer TM is deposited on the semiconductor layer A. The deposition methods of the semiconductor layer A and the top metal layer TM may be the same as or similar to those of the embodiments as shown in FIG. 4A, so they can be referred to the description about FIG. 4A and will not be repeated here.

As shown in FIG. 7A, a second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 1A and 1B and will not be repeated here. The second patterned photoresist PR2 has first hollow portions H1 exposing portions of the top metal layer TM.

Figure 7B:
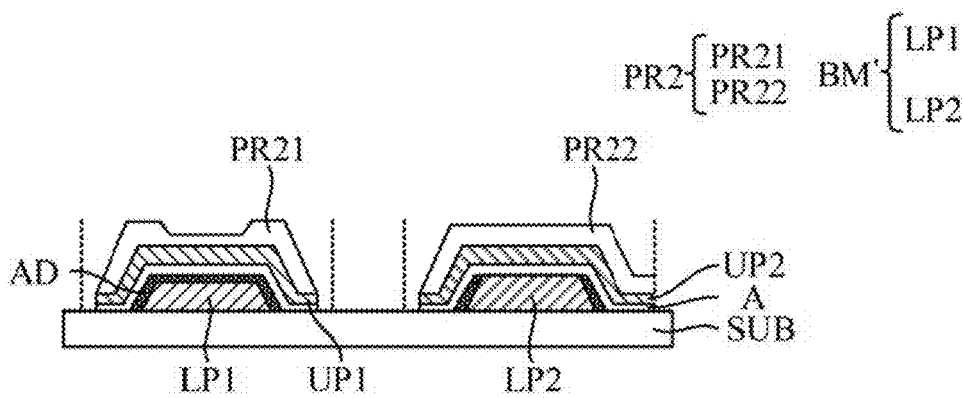

Reference is made to FIG. 7B. FIG. 7B is a schematic cross-sectional view of an intermediate stage of a method of manufacturing an interconnection structure according to some embodiments of the present disclosure. The intermediate stage shown in FIG. 7A may be sequentially followed by the intermediate stage shown in FIG. 7B. As shown in FIG. 7B, the top metal layer TM is etched through the second patterned photoresist PR2 to form a first upper metal pattern UP1 and a second upper metal pattern UP2. The first upper metal pattern UP1 is above the anodized first lower metal pattern LP1 and covered by a first mask portion PR21 of the second patterned photoresist PR2. The second upper metal pattern UP2 is above the anodized second lower metal pattern LP2 and covered by a second mask portion PR22 of the second patterned photoresist PR2.

Figure 7C:
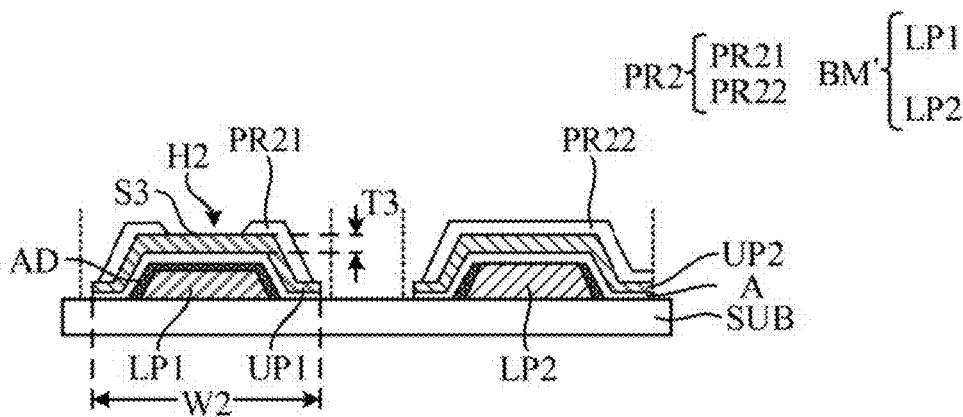

Reference is made to FIG. 7C. FIG. 7C is a schematic cross-sectional view of an intermediate stage of a method of manufacturing an interconnection structure according to some embodiments of the present disclosure. The intermediate stage shown in FIG. 7B may be sequentially followed by the intermediate stage shown in FIG. 7C. As shown in FIG. 7C, a part of the first mask portion PR21 of the second patterned photoresist PR2 is removed to form a second hollow portion H2. The second hollow portion H2 exposes a surface portion S3 of the first upper metal pattern UP1. In some embodiments, an ashing process is performed to the second patterned photoresist PR2 until the second hollow portion H2 is formed to expose the surface portion S3 of the first upper metal pattern UP1. In some embodiments, oxygen plasma is used in the ashing process to perform the erosion of the second patterned photoresist PR2.

Figure 7D:
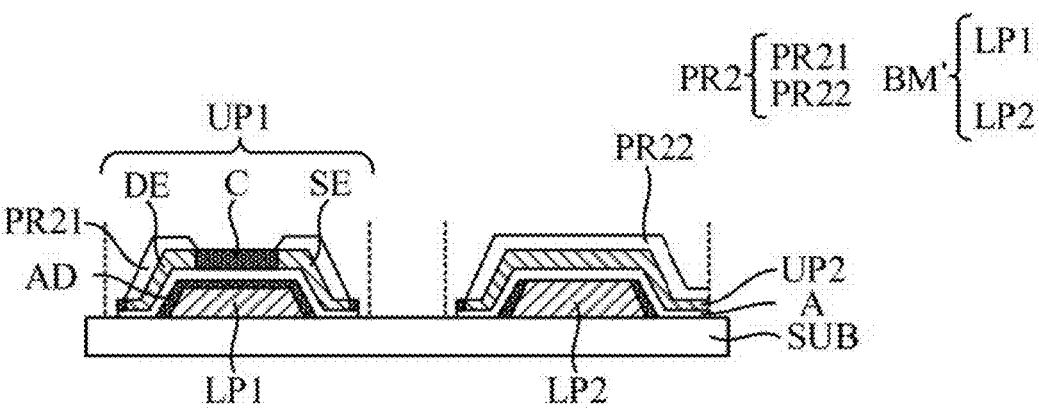

Reference is made to FIG. 7D. FIG. 7D is a schematic cross-sectional view of an intermediate stage of a method of manufacturing an interconnection structure according to some embodiments of the present disclosure. The intermediate stage shown in FIG. 7C may be sequentially followed by the intermediate stage shown in FIG. 7D. As shown in FIG. 7D, the surface portion S3 of the first upper metal pattern UP1 is anodized until the first upper metal pattern UP1 has a drain electrode DE, a source electrode SE, and an anodized segment C connected between and electrically isolating the drain electrode DE and the source electrode SE. The anodized segment C serves as a channel protect structure.

In some embodiments, the etched bottom metal layer BM' is anodized to reach a termination voltage. The first lower metal pattern LP1 has a thickness T1 (e.g., a vertical length of the first lower metal pattern LP1 in FIG. 1D) before being anodized, and the termination voltage is less than the thickness T1 in nm divided by 0.9 nm-V$^{-1}$. In this way, the etched bottom metal layer BM' will not be fully anodized and leave conductive parts.

In some embodiments, the surface portion S3 of the first upper metal pattern UP1 is anodized to reach a termination voltage. The first upper metal pattern UP1 has a width W2 and a thickness T3 before being anodized, as shown in FIG. 7C. The termination voltage is greater than a smallest one of the width W2 and the thickness T2 in nm divided by 1.0 nm-V$^{-1}$. In this way, it can be ensured that the anodized segment C can reach the side of the first upper metal pattern UP1 facing the semiconductor layer A, as shown in FIG. 7D.

Figure 7E:
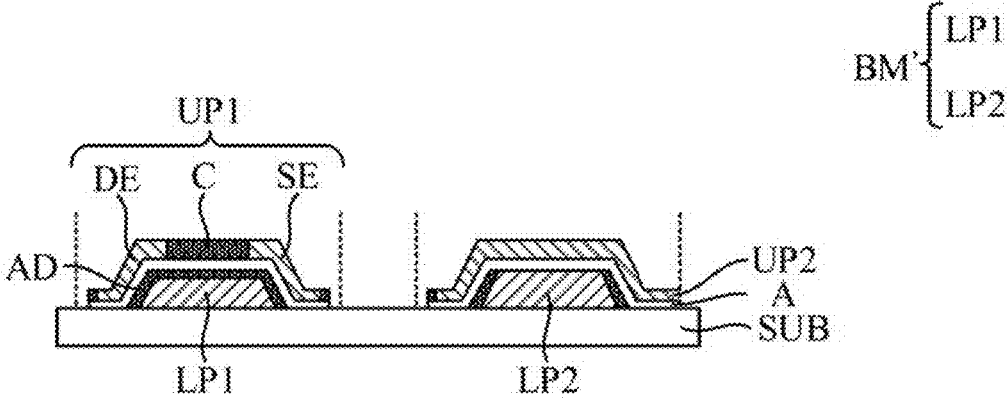

Reference is made to FIG. 7E. FIG. 7E is a schematic cross-sectional view of an intermediate stage of a method of manufacturing an interconnection structure according to some embodiments of the present disclosure. The intermediate stage shown in FIG. 7D may be sequentially followed by the intermediate stage shown in FIG. 7E. As shown in FIG. 7E, the second patterned photoresist PR2 is removed to expose the first upper metal pattern UP1 and the second upper metal pattern UP2.

Figure 8A:
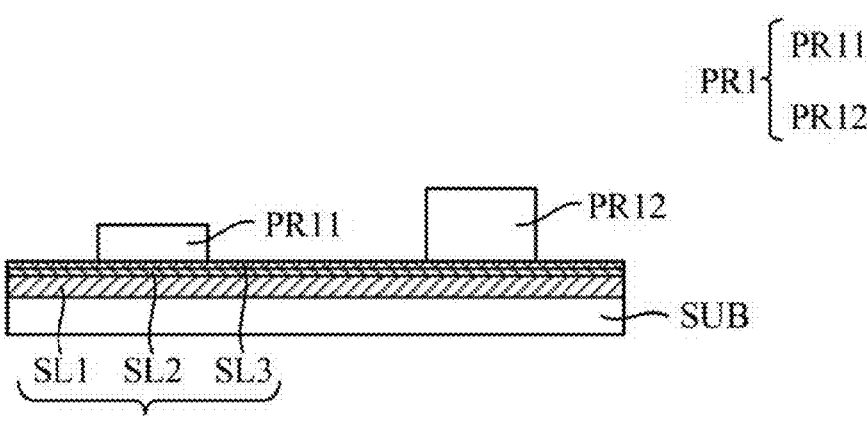
FIGS. 8A to 8F are schematic cross-sectional views of intermediate stages of a method of manufacturing an interconnection structure according to some embodiments of the present disclosure.

Reference is made to FIG. 8A. FIG. 8A is a schematic cross-sectional view of an intermediate stage of a method of manufacturing an interconnection structure according to some embodiments of the present disclosure. In some embodiments, the intermediate stage shown in FIG. 1A may be directly followed by the intermediate stage shown in FIG. 8A. In other words, the bottom metal layer BM in FIG. 1A is replaced by a bottom metal layer BM-1 in FIG. 8A. As shown in FIG. 8A, the bottom metal layer BM-1 is a multi-layer structure. Specifically, the bottom metal layer BM-1 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process. The anodization effect of molybdenum is not good, but it can be used as a barrier metal.

In some embodiments, the third sub-layer SL3 contains copper, but the disclosure is not limited in this regard. The third sub-layer SL3 which contains copper can increase the electrical conductivity of an entirety of the bottom metal layer BM-1. In some embodiments, the second sub-layer SL2 which contains molybdenum can serve as a barrier layer to prevent copper diffusion from the third sub-layer SL3 which contains copper.

In some other embodiments, the third sub-layer SL3 may contain a barrier metal such as tantalum, titanium, or tungsten, but the disclosure is not limited in this regard.

In some embodiments, one of the second sub-layer SL2 and the third sub-layer SL3 may be omitted. For example, in some embodiments, the bottom metal layer BM-1 may be a double-layer structure only including the first sub-layer SL1 and the second sub-layer SL2 which contains molybdenum. In some other embodiments, the bottom metal layer BM-1 may be a double-layer structure only including the first sub-layer SL1 and the third sub-layer SL3 which contains copper.

Figure 8B:
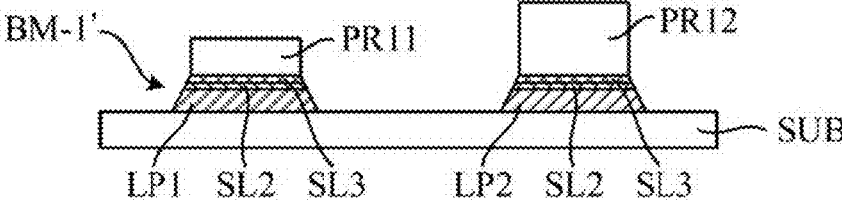

Reference is made to FIG. 8B. FIG. 8B is a schematic cross-sectional view of an intermediate stage of a method of manufacturing an interconnection structure according to some embodiments of the present disclosure. The intermediate stage shown in FIG. 8A may be sequentially followed by the intermediate stage shown in FIG. 8B. As shown in FIG. 8B, the bottom metal layer BM-1 is etched through the first patterned photoresist PR1, such that the etched bottom metal layer BM-1' includes a first lower metal pattern LP1 and a second lower metal pattern LP2 that are sequentially covered by the second sub-layer SL2 and the third sub-layer SL3. In addition, the first lower metal pattern LP1 and a second lower metal pattern LP2 are respectively covered by the first mask portion PR11 and the second mask portion PR12.

Figure 8C:
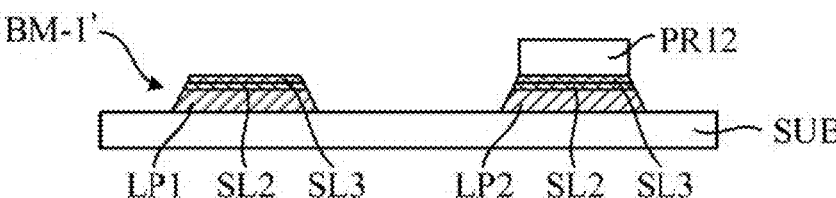

Reference is made to FIG. 8C. FIG. 8C is a schematic cross-sectional view of an intermediate stage of a method of manufacturing an interconnection structure according to some embodiments of the present disclosure. The intermediate stage shown in FIG. 8B may be sequentially followed by the intermediate stage shown in FIG. 8C. As shown in FIG. 8C, the first mask portion PR11 is removed to expose a top surface of the third sub-layer SL3 above the first lower metal pattern LP1. The step of removing the first mask portion PR11 as shown in FIG. 8C is the same as or similar to that as shown in FIG. 1D, so it can be referred to the description about FIG. 1D and will not be repeated here.

Figure 8D:
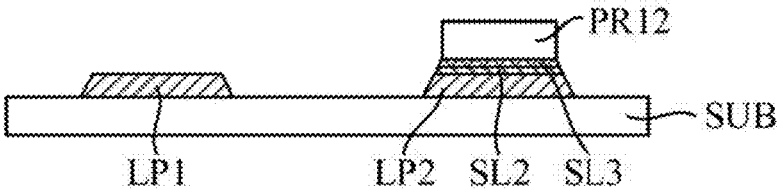

Reference is made to FIG. 8D. FIG. 8D is a schematic cross-sectional view of an intermediate stage of a method of manufacturing an interconnection structure according to some embodiments of the present disclosure. The intermediate stage shown in FIG. 8C may be sequentially followed by the intermediate stage shown in FIG. 8D. As shown in FIG. 8D, the third sub-layer SL3 and the second sub-layer SL2 above the first lower metal pattern LP1 are selectively etched (relative to the first sub-layer SL1) to expose a top surface of the first lower metal pattern LP1.

In some embodiments, the second sub-layer SL2 which contains molybdenum may be etched by using a solution containing hydrogen peroxide and citric acid.

In some embodiments, an etch selectivity of the second sub-layer SL2 and the first sub-layer SL1 in the selectively etching is higher than 2.0.

In some embodiments, the second sub-layer SL2 may be omitted. That is, the bottom metal layer BM-1 may only include the first sub-layer SL1 which contains aluminum and the third sub-layer SL3 which contains copper.

Figure 8E:
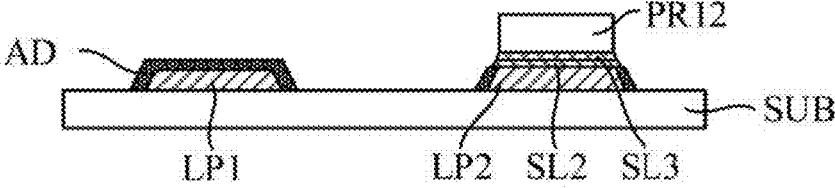

Reference is made to FIG. 8E. FIG. 8E is a schematic cross-sectional view of an intermediate stage of a method of manufacturing an interconnection structure according to some embodiments of the present disclosure. The intermediate stage shown in FIG. 8D may be sequentially followed by the intermediate stage shown in FIG. 8E. As shown in FIG. 8E, the first lower metal pattern LP1 and the second lower metal pattern LP2 are anodized. The step of anodizing the first lower metal pattern LP1 and the second lower metal pattern LP2 as shown in FIG. 8E is the same as or similar to that as shown in FIG. 1E, so it can be referred to the description about FIG. 1E and will not be repeated here.

Figure 8F:
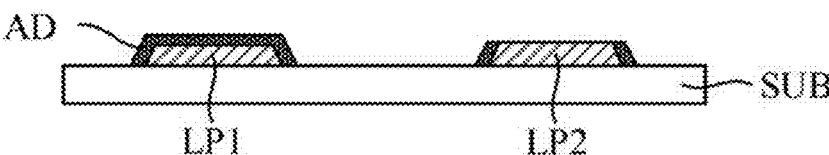

Reference is made to FIG. 8F. FIG. 8F is a schematic cross-sectional view of an intermediate stage of a method of manufacturing an interconnection structure according to some embodiments of the present disclosure. The intermediate stage shown in FIG. 8E may be sequentially followed by the intermediate stage shown in FIG. 8F. As shown in FIG. 8F, the second mask portion PR12 is removed to expose a top surface of the third sub-layer SL3 above the second lower metal pattern LP2. The step of removing the second mask portion PR12 as shown in FIG. 8F is the same as or similar to that as shown in FIG. 1F, so it can be referred to the description about FIG. 1F and will not be repeated here.

In addition, as shown in FIG. 8F, after the second mask portion PR12 is removed, the second sub-layer SL2 and the third sub-layer SL3 of the second lower metal pattern LP2 are selectively etched (relative to the first sub-layer SL1) to expose a top surface of the second lower metal pattern LP2 that is unanodized. The step of removing the second sub-layer SL2 and the third sub-layer SL3 as shown in FIG. 8F is the same as or similar to that as shown in FIG. 8D, so it can be referred to the description about FIG. 8D and will not be repeated here. In some embodiments, the intermediate stage shown in FIG. 8F may be sequentially followed by the intermediate stage shown in FIGS. 4A to 4E.

Figure 9A:
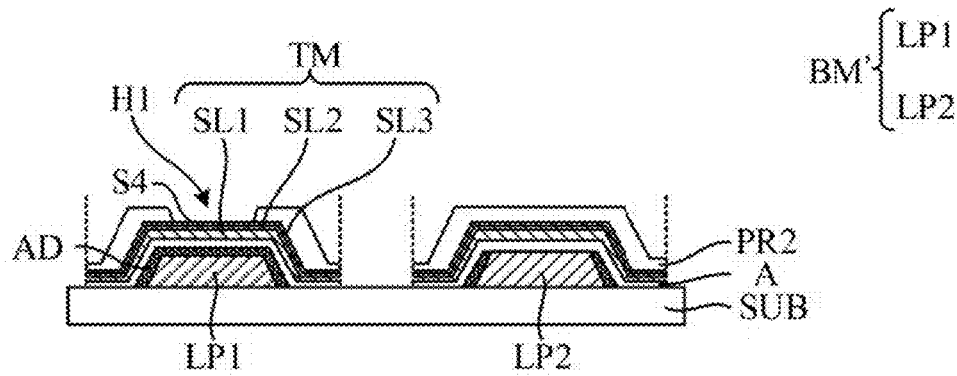
FIGS. 9A to 9C are schematic cross-sectional views of intermediate stages of a method of manufacturing an interconnection structure according to some embodiments of the present disclosure.

Reference is made to FIG. 9A. FIG. 9A is a schematic cross-sectional view of an intermediate stage of a method of manufacturing an interconnection structure according to some embodiments of the present disclosure. In some embodiments, the intermediate stage shown in FIG. 1F may be directly followed by the intermediate stage shown in FIG. 9A. As shown in FIG. 9A, a semiconductor layer A is deposited on the anodized bottom metal layer BM'. A top metal layer TM is deposited on the semiconductor layer A. A second patterned photoresist PR2 is formed on the top metal layer TM. In other words, the top metal layer TM in FIG. 4A is replaced by the top metal layer TM in FIG. 9A. As shown in FIG. 9A, the top metal layer TM is a multi-layer structure. Specifically, the top metal layer TM includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2. In addition, the second patterned photoresist PR2 has a first hollow portion H1 exposing a surface portion S4 of the top metal layer TM. The surface portion S4 is a portion of the top surface of the third sub-layer SL3 right above the first lower metal pattern LP1.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process.

In some embodiments, the third sub-layer SL3 contains copper, but the disclosure is not limited in this regard.

In some embodiments, one of the second sub-layer SL2 and the third sub-layer SL3 may be omitted.

In some embodiments, the step of depositing the semiconductor layer A as shown in FIG. 9A is the same as or similar to that as shown in FIG. 4A, so it can be referred to the description about FIG. 4A and will not be repeated here. In some embodiments, the step of forming the second patterned photoresist PR2 as shown in FIG. 9A is the same as or similar to that as shown in FIG. 4A, so it can be referred to the description about FIG. 4A and will not be repeated here.

Figure 9B:
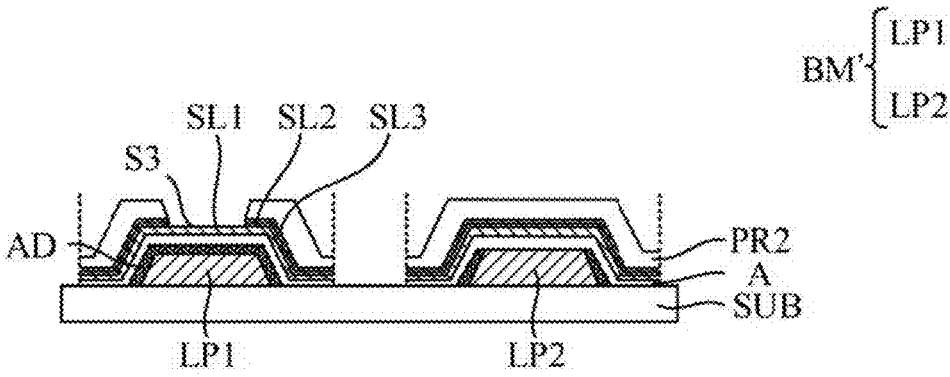

Reference is made to FIG. 9B. FIG. 9B is a schematic cross-sectional view of an intermediate stage of a method of manufacturing an interconnection structure according to some embodiments of the present disclosure. The intermediate stage shown in FIG. 9A may be sequentially followed by the intermediate stage shown in FIG. 9B. As shown in FIG. 9B, the third sub-layer SL3 and the second sub-layer SL2 in the first hollow portion H1 are selectively etched relative to the first sub-layer SL1 to expose a surface portion S3 of the first sub-layer SL1 in the first hollow portion H1.

In some embodiments, the second sub-layer SL2 which contains molybdenum may be etched by using hydrogen peroxide and citric acid solution.

In some embodiments, an etch selectivity of the second sub-layer SL2 and the first sub-layer SL1 in the selectively etching is higher than 2.0.

In some embodiments, the second sub-layer SL2 may be omitted. That is, the top metal layer TM may only include the first sub-layer SL1 which contains aluminum and the third sub-layer SL3 which contains copper.

Figure 9C:
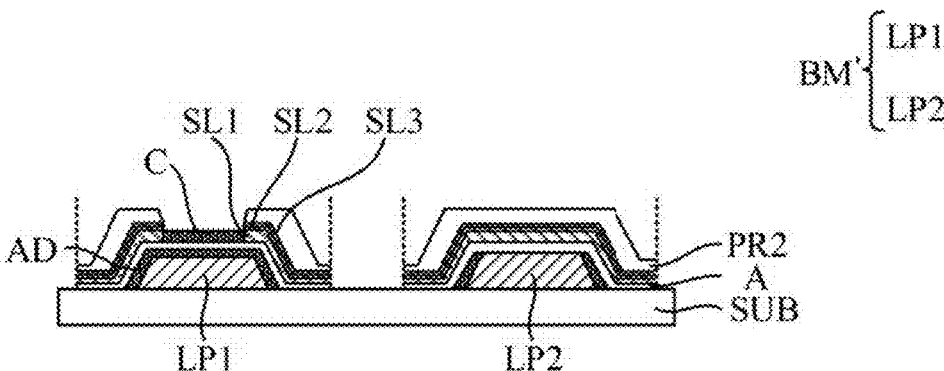

Reference is made to FIG. 9C. FIG. 9C is a schematic cross-sectional view of an intermediate stage of a method of manufacturing an interconnection structure according to some embodiments of the present disclosure. The intermediate stage shown in FIG. 9B may be sequentially followed by the intermediate stage shown in FIG. 9C. As shown in FIG. 9C with reference to FIG. 9B, the surface portion S3 of the first sub-layer SL1 exposed by the first hollow portion H1 is anodized through the second patterned photoresist PR2 until the top metal layer TM has an anodized segment C extended from the surface portion of the first sub-layer SL1 exposed by the first hollow portion H1 to a side of the first sub-layer SL1 facing the semiconductor layer A. In some embodiments, the step of anodizing the first sub-layer SL1 of the top metal layer TM as shown in FIG. 9C is the same as or similar to that as shown in FIG. 4B, so it can be referred to the description about FIG. 4B and will not be repeated here.

In some embodiments, the top metal layer TM as shown in FIG. 7A may be replaced by the top metal layer TM as shown in FIG. 9A, and after the top metal layer TM is exposed by the second hollow portion H2 of the second patterned photoresist PR2 as shown in FIG. 7C, the third sub-layer SL3 and the second sub-layer SL2 in the second hollow portion H2 can be selectively etched relative to the first sub-layer SL1 to expose the first sub-layer SL1. Afterwards, the step of anodizing the top metal layer TM (as the intermediate stage shown in FIG. 7D) and the step of removing the second patterned photoresist PR2 can be sequentially performed.

According to the foregoing recitations of the embodiments of the disclosure, it can be seen that the method of manufacturing an interconnection structure of the present disclosure only uses two sets of PEP. In addition, the method of the present disclosure can also be used to manufacture a thin-film transistor by only using two sets of PEP. Therefore, the manufacturing cost can be significantly reduced and the manufacturing efficiency can be effectively enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing an interconnection structure, comprising:

forming a first patterned photoresist on a bottom metal layer having an atomic ratio of aluminum greater than 80%, wherein the first patterned photoresist has a first mask portion and a second mask portion thicker than the first mask portion;

etching the bottom metal layer through the first patterned photoresist to form a first lower metal pattern and a second lower metal pattern respectively covered by the first and second mask portions;

removing the first mask portion;

anodizing the etched bottom metal layer, wherein the anodized bottom metal layer has an unanodized part after the anodizing;

removing the second mask portion to expose a surface portion of the second lower metal pattern that is unanodized;

depositing a conductive layer on the anodized bottom metal layer, wherein the conductive layer is in contact with the surface portion of the second lower metal pattern; and etching the conductive layer through a second patterned photoresist to form a first upper conductive pattern and a second upper conductive pattern, wherein the first upper conductive pattern is above and electrically isolated from the first lower metal pattern by an anodized part of the bottom metal layer, the second upper conductive pattern is above the second lower metal pattern and in contact with the surface portion of the second lower metal pattern, and the first and second upper conductive patterns entirely cover all non-insulated top surface of the anodized bottom metal layer.

2. The method of claim 1, wherein the anodizing the etched bottom metal layer is performed to reach a termination voltage, each of the first and second lower metal patterns has a thickness and a width, and the termination voltage is less than a smallest one of the thickness and the width in nm divided by 0.9 nm-V$^{-1}$.

3. The method of claim 1, wherein a thickness of the unanodized part of the etched bottom metal layer after being anodizing is equal to or greater than $\frac{1}{10}$ of a thickness of the etched bottom metal layer before being anodizing.

4. The method of claim 1, wherein the bottom metal layer comprises:

a first sub-layer containing aluminum; and a second sub-layer on and contacting the first sub-layer.

5. The method of claim 4, further comprising:

selectively etching the second sub-layer relative to the first sub-layer after the removing the first mask portion and before the anodizing the etched bottom metal layer.

6. The method of claim 4, wherein the second sub-layer contains molybdenum.

7. The method of claim 1, wherein the anodizing the etched bottom metal layer is performed by applying a constant current between 0.05 mA/cm$^2$ and 5 mA/cm$^2$.

8. The method of claim 1, wherein the anodizing the etched bottom metal layer uses an electrolyte with a pH value between pH5 and pH8.

9. The method of claim 1, wherein an etch selectivity of the conductive layer and the anodized part of the etched bottom metal layer in the etching the conductive layer is higher than 5.0.

10. The method of claim 1, wherein the depositing the conductive layer comprises:

depositing a semiconductor layer on the anodized bottom metal layer; and depositing a top metal layer on the semiconductor layer, wherein the method further comprises:

removing a part of the second patterned photoresist to expose a surface portion of the top metal layer after the etching the conductive layer; and anodizing the surface portion of the top metal layer until the top metal layer has an anodized segment extended from the surface portion of the top metal layer to a surface of the top metal layer in contact with the semiconductor layer.

11. The method of claim 10, wherein the top metal layer comprises:

a first sub-layer containing aluminum; and a second sub-layer on and contacting the first sub-layer.

12. The method of claim 11, wherein the second sub-layer contains copper.

13. The method of claim 10, wherein the surface of the top metal layer in contact with the semiconductor layer contains aluminum.

14. The method of claim 13, wherein an atomic ratio of aluminum in the top metal layer is greater than 80%.

15. The method of claim 10, further comprising:

annealing the semiconductor layer.

16. The method of claim 10, wherein a thickness of the semiconductor layer is equal to or smaller than 100 nm.

17. The method of claim 1, wherein the depositing the conductive layer comprises:

depositing a semiconductor layer on the anodized bottom metal layer; and depositing a top metal layer on the semiconductor layer, wherein the method further comprises:

anodizing the top metal layer through a first hollow portion of the second patterned photoresist before the etching the conductive layer; and forming a second hollow portion in the second patterned photoresist after the anodizing the top metal layer, wherein the etching the conductive layer comprises etching the conductive layer through the second hollow portion to form the first upper conductive pattern and the second upper conductive pattern.

* * * * *